US012573943B2

(12) United States Patent
Foran et al.

(10) Patent No.: US 12,573,943 B2
(45) Date of Patent: Mar. 10, 2026

(54) CYCLE-BY-CYCLE OVERCURRENT DETECTOR

(71) Applicant: Renesas Electronics America Inc., Milpitas, CA (US)

(72) Inventors: Ryan Patrick Foran, Bullock, NC (US); Yashovardhan Rao Potlapalli, Cary, NC (US)

(73) Assignee: Renesas Electronics America Inc., Milpitas, CA (US)

( * ) Notice: Subject to any disclaimer, the term of this patent is extended or adjusted under 35 U.S.C. 154(b) by 197 days.

(21) Appl. No.: 18/593,434

(22) Filed: Mar. 1, 2024

(65) Prior Publication Data

US 2024/0297575 A1     Sep. 5, 2024

Related U.S. Application Data

(60) Provisional application No. 63/488,455, filed on Mar. 3, 2023.

(51) Int. Cl.
*H02M 1/32* (2007.01)
*G01R 19/165* (2006.01)
*H02M 3/158* (2006.01)

(52) U.S. Cl.
CPC ........ *H02M 1/32* (2013.01); *G01R 19/16552* (2013.01); *H02M 3/158* (2013.01)

(58) Field of Classification Search
CPC .... H02M 3/158; H02M 1/32; G01R 19/16552
See application file for complete search history.

(56) References Cited

U.S. PATENT DOCUMENTS

| | | | | | |
|---|---|---|---|---|---|
| 9,431,974 | B2 * | 8/2016 | Khlat | ...................... | H03F 1/025 |
| 9,806,617 | B1 * | 10/2017 | Ozawa | ................ | H02M 3/1588 |
| 10,720,839 | B1 * | 7/2020 | Yamada | .............. | H02M 1/0061 |
| 2008/0116865 | A1 * | 5/2008 | Rice | .................... | H02M 3/1584 |
| | | | | | 323/280 |
| 2009/0015217 | A1 * | 1/2009 | Harriman | ............ | H02M 3/1588 |
| | | | | | 323/266 |
| 2011/0018507 | A1 * | 1/2011 | McCloy-Stevens | .......................... | |
| | | | | | H02M 3/1588 |
| | | | | | 323/271 |
| 2014/0292298 | A1 * | 10/2014 | Pradhan | .............. | H02M 3/1588 |
| | | | | | 323/286 |
| 2018/0337599 | A1 * | 11/2018 | Chen | ..................... | H02M 3/158 |
| 2023/0378864 | A1 * | 11/2023 | La Pila | ............... | H02M 1/0009 |

* cited by examiner

*Primary Examiner* — Rafael O De Leon Domenech
(74) *Attorney, Agent, or Firm* — SCULLY, SCOTT, MURPHY & PRESSER, P.C.

(57)     ABSTRACT

Systems and methods for over current protection are described. A controller can receive a differential feedback voltage signal from a power stage. The differential feedback voltage signal can be proportional to an inductor current through an inductor in the power stage. The controller can amplify the differential feedback voltage signal to generate a differential threshold that includes an upper bound and a lower bound. The controller can compare the amplified differential feedback voltage signal with the differential threshold. The controller can, based on a result of the comparison of the amplified differential feedback voltage signal with the differential threshold, determine whether to adjust at least one of a modulator on-time and a modulator off-time of a control signal to limit the inductor current, wherein the control signal is for driving the power stage.

20 Claims, 5 Drawing Sheets

Upslope (@ 1V Vout):
dI/dt = (Vin-Vout) / L
dI/dt = (21-1) / 100n
dI/dt = 200mA / ns Downslope (@ 3V Vout):
dI/dt = Vout / L
dI/dt = 3 / 100n (no body braking)
dI/dt = 30mA / ns inductor current

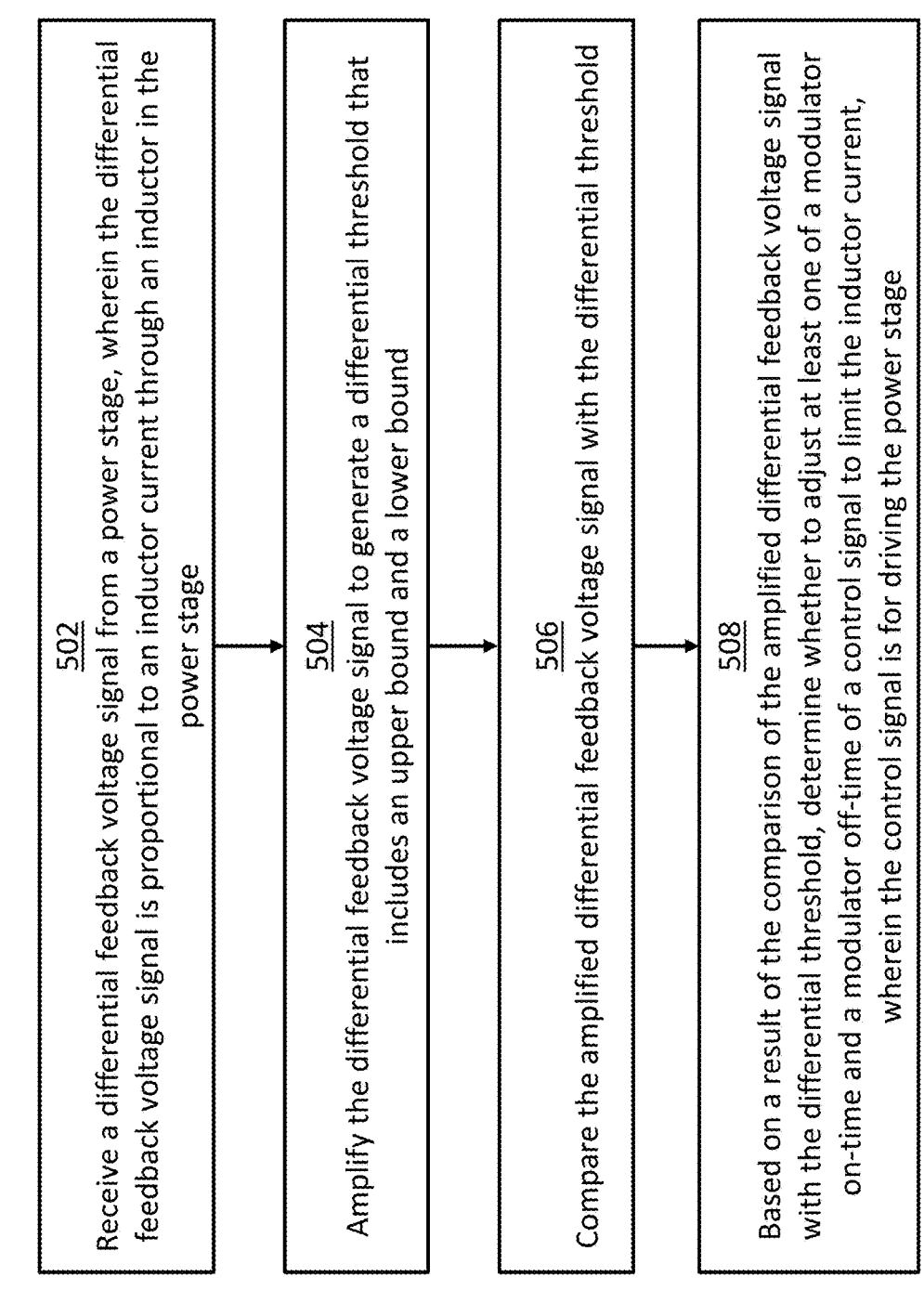

500

502

Receive a differential feedback voltage signal from a power stage, wherein the differential feedback voltage signal is proportional to an inductor current through an inductor in the power stage

504

Amplify the differential feedback voltage signal to generate a differential threshold that includes an upper bound and a lower bound

506

Compare the amplified differential feedback voltage signal with the differential threshold

508

Based on a result of the comparison of the amplified differential feedback voltage signal with the differential threshold, determine whether to adjust at least one of a modulator on-time and a modulator off-time of a control signal to limit the inductor current, wherein the control signal is for driving the power stage

Fig. 5

CYCLE-BY-CYCLE OVERCURRENT DETECTOR

CROSS-REFERENCE TO RELATED APPLICATION

This application is based upon and claims the benefit of priority under 35 U.S.C. 119(e) of U.S. Patent Application No. 63/488,455 filed on Mar. 3, 2023, and titled "CYCLE-BY-CYCLE OVERCURRENT DETECTOR," the entire disclosure of which is incorporated herein by reference in its entirety.

BACKGROUND

The present disclosure relates in general to semiconductor devices. More specifically, the present disclosure relates to switching power supplies.

Switching power supplies typically utilize inductors to regulate output voltages where cycle-by-cycle current limits enable precise control of the maximum current through the inductors and other switching components such as field-effect transistors (FETs). The speed and accuracy of the current limit allows the components to be chosen which are not overrated to provide margin, saving on cost and providing increased performance.

As microprocessor power supplies push for lower inductor values, faster transient responses may be achieved which minimize the need to utilize large capacitor banks and saves on both board area and component costs.

High input supply voltages may be particularly desirable, especially in battery powered systems such as notebook computers. When low inductance inductors are used at the output, The combination of high input voltage and low output voltage can make the inductor current slew up rapidly, decreasing the time allowable to detect over current conditions.

SUMMARY

In an embodiment, a system is generally described. The system can include a power stage connected to an inductor and being configured to drive an inductor current through the inductor to a power supply output. The system can further include a controller configured to generate a control signal to drive the power stage. The system can further include a current limit circuit. The current limit circuit can be configured to receive a differential feedback voltage signal from the power stage. The differential feedback voltage signal can be proportional to the inductor current. The current limit circuit can be further configured to amplify the differential feedback voltage signal to generate a differential threshold that includes an upper bound and a lower bound. The current limit circuit can be further configured to compare the amplified differential feedback voltage signal with the differential threshold. The current limit circuit can be further configured to output an over current limit signal to the modulator, wherein the over current limit signal is based on a result of the comparison of the amplified differential feedback voltage signal with the differential threshold. The controller can be further configured to determine whether to adjust at least one of a modulator on-time and a modulator off-time of the control signal to limit the inductor current based on the over current limit signal.

In an embodiment, a method for over current protection is generally described. The method can include receiving a differential feedback voltage signal from a power stage. The differential feedback voltage signal can be proportional to an inductor current through an inductor in the power stage. The method can further include amplifying the differential feedback voltage signal to generate a differential threshold that includes an upper bound and a lower bound. The method can further include comparing the amplified differential feedback voltage signal with the differential threshold. The method can further include, based on a result of the comparison of the amplified differential feedback voltage signal with the differential threshold, determine whether to adjust at least one of a modulator on-time and a modulator off-time of a control signal to limit the inductor current, wherein the control signal is for driving the power stage.

In an embodiment, a semiconductor device is generally described. The semiconductor device can include a modulator configured to generate a control signal to drive a power stage. The semiconductor device can further include a current limit circuit. The current limit circuit can be configured to receive a differential feedback voltage signal from the power stage. The differential feedback voltage signal can be proportional to an inductor current through an inductor in the power stage. The current limit circuit can be further configured to amplify the differential feedback voltage signal to generate a differential threshold that includes an upper bound and a lower bound. The current limit circuit can be further configured to compare the amplified differential feedback voltage signal with the differential threshold. The current limit circuit can be further configured to output an over current limit signal to the modulator, wherein the over current limit signal is based on a result of the comparison of the amplified differential feedback voltage signal with the differential threshold. The modulator can be further configured to determine whether to adjust at least one of a modulator on-time and a modulator off-time of the control signal to limit the inductor current based on the over current limit signal.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

BRIEF DESCRIPTION OF THE DRAWINGS

FIG. 5 is a flow diagram illustrating a process to implement cycle-by-cycle over current limit circuit in one embodiment.

DETAILED DESCRIPTION

Figure 1:
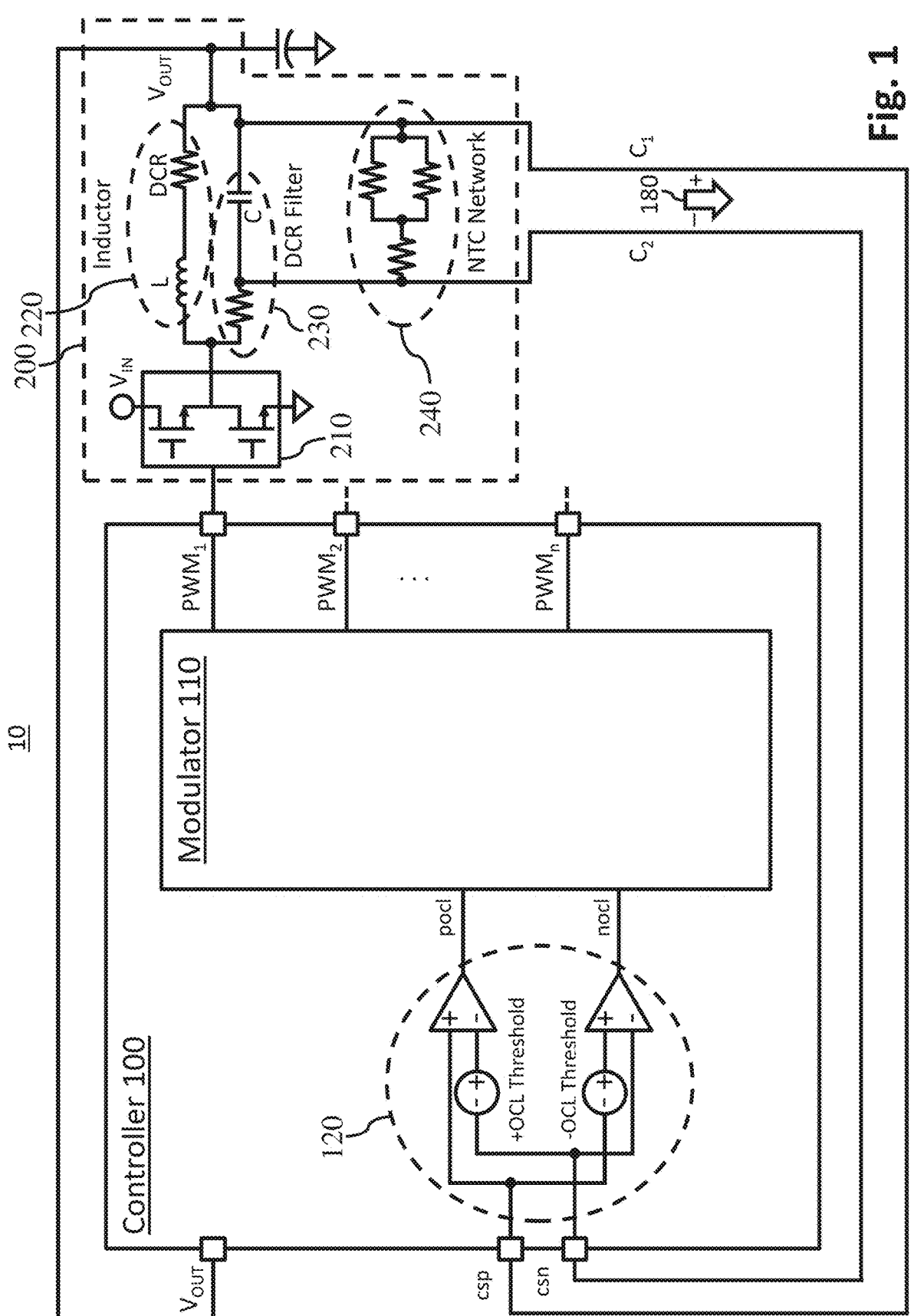
FIG. 1 is a diagram illustrating an example system that implements cycle-by-cycle current limit functionality according to an embodiment.

FIG. 1 is a diagram showing a switching power supply system 10 comprising a controller 100 and a power stage 200.

Controller 100 comprises a modulator 110 and a cycle-by-cycle current limit circuit 120. Controller 100 comprises, for example, a processor, microcontroller, central processing unit (CPU), field-programmable gate array (FPGA) or any other circuitry for controlling power delivery via power stage 200.

Modulator 110 is configured to output one or more pulse-width modulation (PWM) signals $PWM_1$, $PWM_2$, . . . $PWM_n$ to corresponding power stages 200. In the illustration, only the power stage 200 for $PWM_1$ is illustrated for brevity. Any other number of power stages 200 with similar circuitry may also or alternatively be utilized.

Power stage 200 includes a power driver 210, an inductor circuit 220, a DC resistance (DCR) filter circuit 230 and a negative temperature coefficient (NTC) network circuit 240. Power driver 210 comprises switches, e.g., field-effect transistors (FETs), arranged in series between an input power supply $V_{IN}$ and ground. In some embodiments, for example, $V_{IN}$ may have a relatively large power supply voltage, e.g., 21V.

Controller 100 can use the PWM signals generated by modulator 110 as control signals for driving the power stage 200. Power stage 200 can be driven to convert an input voltage $V_{IN}$ into an output voltage $V_{OUT}$ and $V_{OUT}$ can be provided to a load (not shown). An inductor L is connected between a switch node of power stage 200 and the output $V_{OUT}$.

Inductor circuit 220 is connected between switching power supply 210 and $V_{OUT}$ and comprises an inductor L. In an aspect, the inductor L has parasitic resistance, which can be a finite DC resistance (DCR), associated with the material that it is made of. DCR filter circuit 230 is connected between switching power supply 210 and $V_{OUT}$, in parallel with inductor circuit 220, and comprises a resistor in series with a capacitor C. DCR filter circuit 230 can be configured to perform DCR filtering, where DCR filtering can refer to using the parasitic resistance of inductor L to sense the current thru the inductor. The differential feedback signal received by cycle-by-cycle current limit circuit 120 can be proportional to the DCR of the inductor, or proportional to the inductor current of the inductor L. In some embodiments, the target $V_{OUT}$ may comprise a relatively small voltage as compared to the power supply voltage, e.g., 1V.

Cycle-by-cycle current limit circuit 120 can receive a differential feedback voltage signal 180 from power stage 200 via connections $C_1$ and $C_2$. The negative polarity voltage of differential feedback voltage signal 180 can be received via the connection $C_1$ and the positive polarity voltage of differential feedback voltage signal 180 can be received via the connection $C_2$. The currents of the opposing polarity (positive and negative polarities) in the differential feedback voltage signal 180 can be sensed and received at positive current sense (csp) and negative current sense (csn) pins of controller 100 shown in FIG. 1. The cycle-by-cycle current limit circuit 120 can output positive over current limit (pocl) and negative over current limit (nocl) signals to modulator 110 for use in adjusting the corresponding PWM signals, e.g., truncating or reducing at least one of the on-time and the off-time of the PWM signals to limit the inductor current.

NTC network circuit 240 is connected between connections $C_1$ and connection $C_2$ in parallel with the capacitor C of DCR filter circuit 230. NTC network circuit 240 is configured to perform a linear correction of the differential feedback voltage signal on connections $C_1$ and $C_2$ based on temperature changes in the power stage 200. NTC network circuit 240 may comprise, for example, a thermistor and one or more resistors.

The usage of the pocl and nocl signals to adjust the PWM signals can provide over current protection for the system 10 and protect the field-effect transistors (FETs) in power stage 200 and inductor L from currents beyond their ratings. Cycle-by-cycle current limit circuit 120 comprises comparators that are configured to compare the differential feedback voltage signal 180 received at the csp and csn pins to a differential threshold that corresponds to an over current limit (OCL) threshold value. In the example shown in FIG. 1, the differential threshold can include an upper bound labeled as +OCL Threshold and a lower bound labeled as −OCL Threshold. While comparators for the voltages at the csp and csn pins are illustrated in FIG. 1, in some embodiments, only one of the pocl and nocl outputs may be utilized. For example, in some embodiments, modulator 110 may be configured to act on the value of one of pocl or nocl to adjust the corresponding PWM signal.

Figure 2:
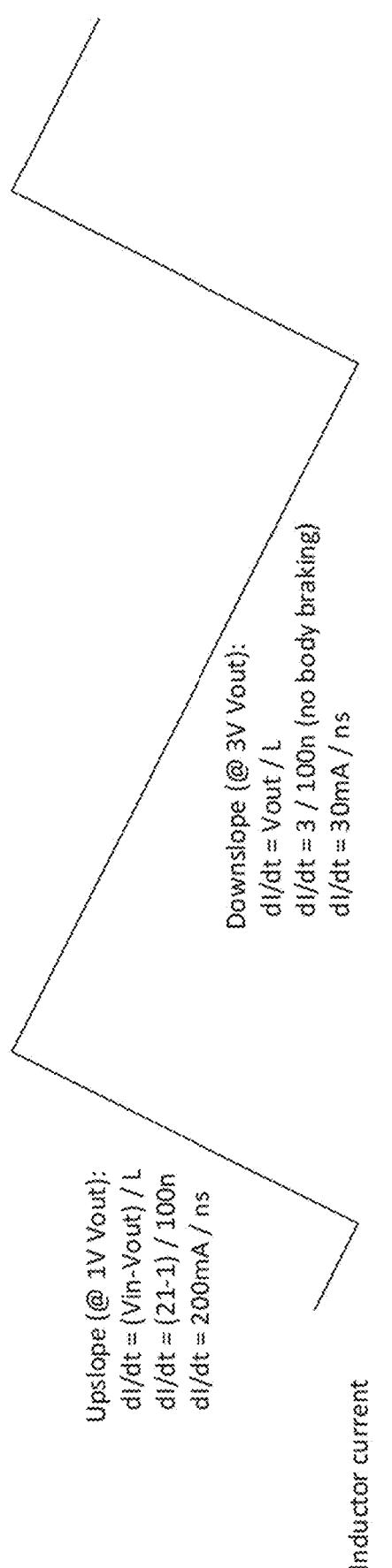
FIG. 2 is a signal diagram illustrating example inductor current values according to an embodiment.

With reference to FIG. 2, an example signal diagram showing a non-limited inductor current on inductor L (see FIG. 1) will be described according to an embodiment. As seen in FIG. 2, the inductor current has an upslope and a downslope, i.e., based on the on-time and off-time of the PWM signal. Note that in the example signal diagram, body braking on the downslope is not taken into account because the system is agnostic to body braking. The voltage across the inductor is proportional to inductance times the rate of current change as set forth in equation (1):

$$V = L \times \frac{di}{dt} \tag{1}$$

Based on equation (1), during the upslope, the change in current on inductor L is determined according to equation (2):

$$\frac{di}{dt} = \frac{(VIN - VOUT)}{L} \tag{2}$$

For example, in an embodiment where $V_{IN}$ is 21V and $V_{OUT}$ is 1V and L is 100 nH, $$\frac{di}{dt} = \frac{(21V - 1V)}{100nH} = 200 \text{ mA/ns}$$

on the upslope. During the downslope, the change in current on inductor L is determined according to equation (3):

$$\frac{di}{dt} = \frac{VOUT}{L} \tag{3}$$

For example, in an embodiment where $V_{OUT}$ is 3V and L is 100 nH, $$\frac{di}{dt} = \frac{3V}{100nH} = 30 \text{ mA/ns.}$$

Figure 3:
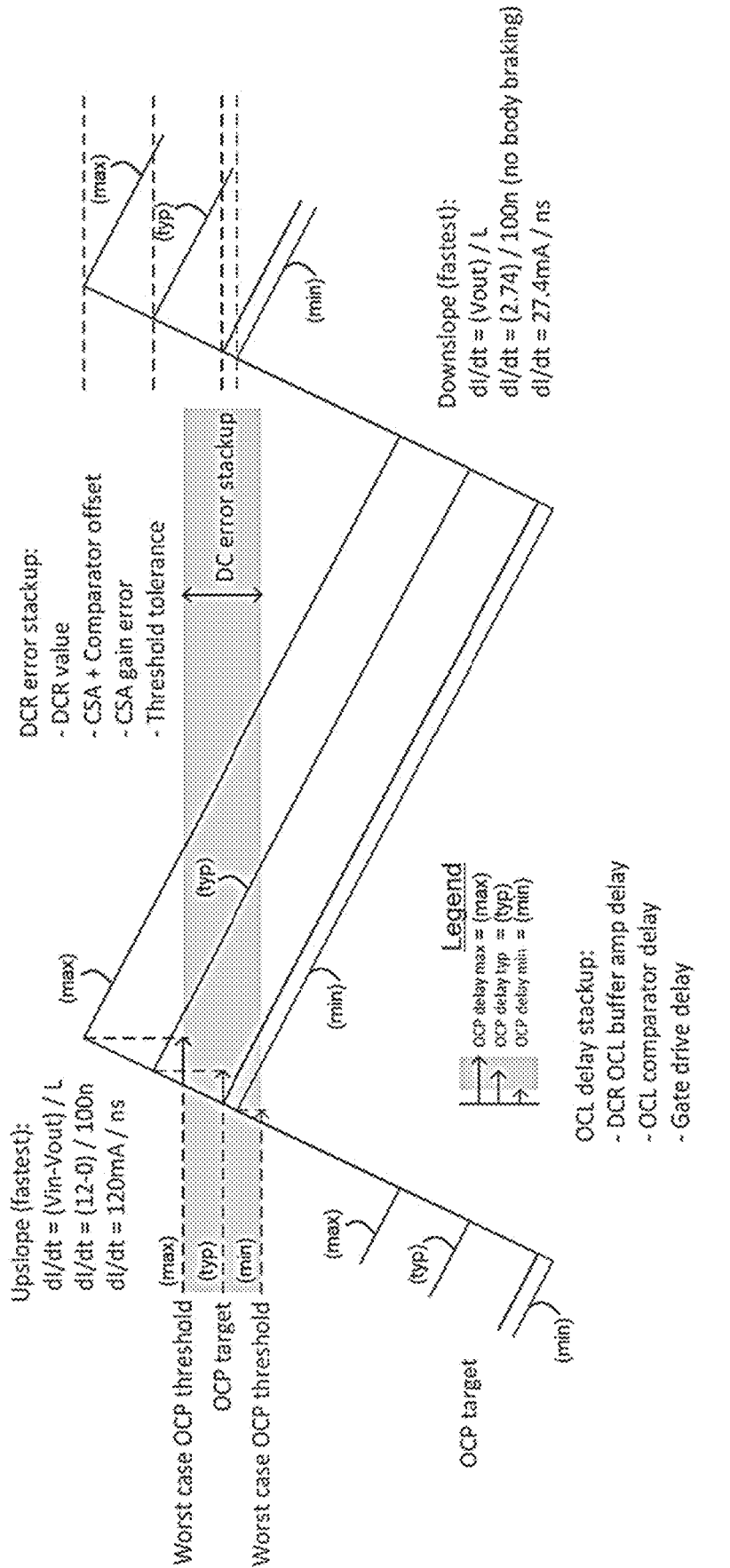
FIG. 3 is a signal diagram illustrating example inductor current values and showing over current protection thresholds according to an embodiment.

With reference to FIG. 3, an example diagram of over-current protection (OCP) ranges is described in an embodiment. The OCP ranges shown in FIG. 3 can be an example of a differential threshold being compared with the differential feedback voltage signal 180 in FIG. 1. The OCP ranges can include a worst case over current protection (OCP) threshold minimum, labeled as (min) in FIG. 3, and the typical (typ) OCP target and the worst case OCP threshold maximum (max), labeled as (max) in FIG. 3. The worst case OCP threshold minimum can be the lower bound of the differential threshold (−OCL Threshold in FIG. 1) and the worst case OCP threshold maximum can be the upper bound of the differential threshold (+OCL Threshold in FIG. 1).

As an example, a fastest upslope may correspond to a $V_{IN}$ of, for example, 12V, a $V_{OUT}$ of 0V and an inductance L of 100 nH giving a di/dt according to equation (2) of 120 mA/ns. The fastest downslope may correspond to a $V_{OUT}$ of, for example, 3V and an inductance L of, for example, 100 mH giving a di/dt according to equation (3) of 30 mA/ns.

As seen in FIG. 3, various delays may be introduced into the OCL including, e.g., DCR OCL buffer amplifier delay, OCL comparator delay, and gate driver delay. In addition, DCR errors may stack up including, e.g., DCR values, CSA and comparator offsets, CSA gain errors and threshold tolerances. The DCR error stackup may correspond to the difference between the max and min OCP thresholds.

The delays and offsets in current limit detection circuitry increase the maximum current that may be possible on the power stage 200 which also increases the rating requirements for the switches and inductor of the power stage 200. For example, the faster that the current limit detection circuitry, the more efficiently the modulator 110 may control the current exposure to the power stage 200 reducing the possible maximum current and therefore the rating requirements for the switches and inductors of the power stage 200.

Figure 4:
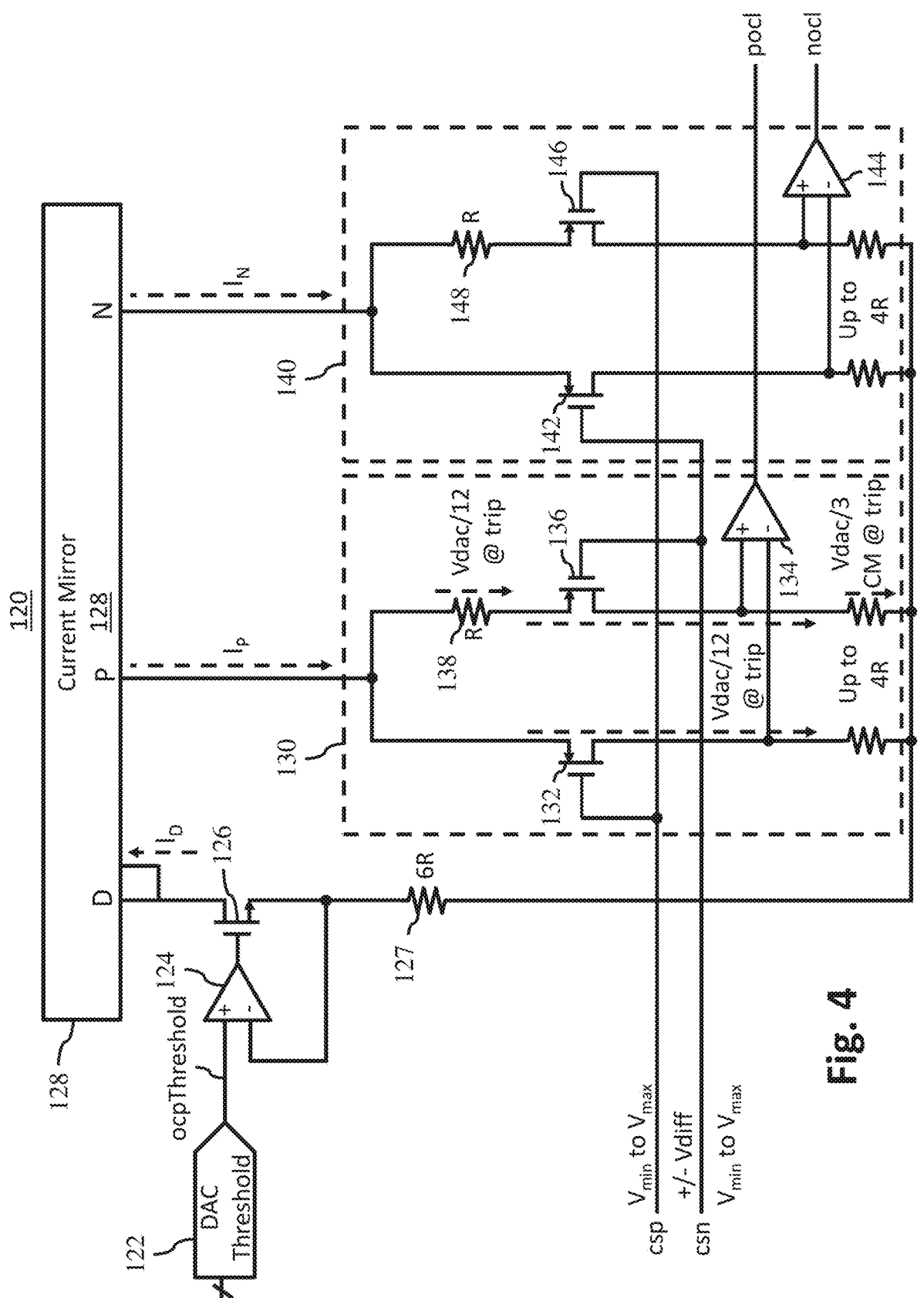
FIG. 4 is a circuit diagram illustrating an example cycle-by-cycle over current limit circuit of the system of FIG. 1 according to an embodiment.

With reference to FIG. 4, a circuit diagram of an example cycle-by-cycle current limit circuit 120 according to an embodiment will be described. A DAC threshold generator 122 receives a digital DAC signal as an input and outputs an analog DAC threshold voltage value ocpThreshold to an amplifier 124 that enforces the voltage threshold ocpThreshold across a resistor 127, e.g., a 6R resistor where R is a predetermined resistance value and ocpThreshold is Vdac, generating a current $I_D$ of Vdac/6R at a connection D of a current mirror circuit 128. Current mirror circuit 128 is connected to the drain of transistor 126 and mirrors the current $I_D$ from connection D to connection P as current $I_P$ and connection N as current $I_N$. In some embodiments, current $I_D$, current $I_P$ and current $I_N$ may also individually or collectively be referred to herein as an initial current, reference current or comparison current. In some embodiments current mirror circuit 128 is a PMOS current mirror circuit 128. Current mirror circuit 128 may provide a relatively slow but accurate current mirror in some embodiments. The incoming DAC signal is adjustable to modify the current being mirrored across to the P and N connections, enabling an adjustment of the threshold offset between the csp and csn signals. In one embodiment, the current $I_P$ and the current Ix can be set by separate DACs (different from DAC threshold generator 122) such that the positive and negative current limits (+OCL Threshold and −OCL Threshold) can be set independently.

Cycle-by-cycle current limit circuit 120 receives differential feedback voltage signal 180 at csp and csn pins. The voltages of differential feedback voltage signal 180 receive at csp and csn pins can each have a value within a predetermined common mode voltage range, e.g., between a minimum voltage $V_{min}$ and a maximum voltage $V_{max}$. In some embodiments, for example, the common mode voltage range at each of csp and csn pins may be the same. In other embodiments, the common mode voltage range at each of csp and csn pins may be different but overlapping. In an embodiment, the wide common mode voltage range at the csp and csn pins can be, for example, −100 mV to 3.1V. In other embodiments, other ranges for the common mode voltage range at csp, csn pins or both may alternatively be utilized.

In addition to the wide common mode voltage range, csp and csn pins can also have a predetermined maximum voltage differential between them, labeled as $V_{diff}$ in FIG. 4. In some embodiments, for example, $V_{diff}$ may be significantly than the common mode voltage range. In an embodiment, for example, $V_{diff}$ may be +/−100 mV. In other embodiments, other values for $V_{diff}$ may alternatively be utilized. In an aspect, the voltage drop across R is the threshold indicating when the amplifier 124 is balanced and at the trip point. At the trip point, half of the DAC current is flowing thru each transistor among transistors 142, 146. Therefore, the voltage drop across resistor 148 having resistance R at the trip point is IDAC*R/2 or Vdac/2. For the resistor 127 having resistance 6R, the DAC current Idac is the DAC voltage across the 6R resistor 127. Therefore, the threshold is Vdac/12. Hence, the DAC can be used for setting the threshold, and the resistors R and 6R can determine the relationship between the DAC voltage Vdac and the trip voltage of the system.

The current $I_P$ output on connection P from current mirror circuit 128, e.g., Vdac/6R, is fed into an amplifier and offset circuit 130 that is configured to compare the voltages from csp and csn pins through an amplification of the current $I_P$ using built-in offset circuitry. Amplifier and offset circuit 130 comprise a transistor 132 having a source connected to current mirror 128, a gate connected to csp, and a drain connected to the negative terminal of a comparator 134. Threshold and comparator circuit 130 also comprises a transistor 136 having a source connected to current mirror 128 via a resistor 138, a gate connected to csn, and a drain connected to the positive terminal of comparator 134. Comparator 134 outputs the pocl signal. Resistor 138 has a resistance of R and is configured to create a current offset for one side of amplifier and offset circuit 130, e.g., the side containing transistor 136 connected to csn, relative to the other side, e.g., the side containing transistor 132 connected to csp.

Transistor 132 is configured to adjust, e.g., amplify or perform another adjustment, the voltage at its source from current mirror 128 based on the voltage at csp and output the adjusted voltage from its drain to the negative terminal of comparator 134. Similarly, transistor 136 is configured to adjust, e.g., amplify or perform another adjustment, the voltage at its source from resistor 138 based on the voltage at csn and output the adjusted voltage from its drain to the positive terminal of comparator 134. Based on the voltages at the drains of transistors 132 and 136, comparator 134 may determine whether or not a trip point, e.g., when the positive and negative terminals of comparator 134 are equal, has been reached or exceeded. In some embodiments, the gain from the amplification by comparator 134 may be 4× or any other amount of gain which may reduce error contributions from comparator 134 as compared to comparing raw, unamplified, signals.

Because of the presence of resistor 138, the current at the sources of transistors 132 and 136 will be offset, e.g., the current at the source of transistor 132 will be lower than the current at the source of transistor 136, such that the trip point of comparator 134 corresponds to a case where the voltage at csn and csp pins have different values, e.g., where voltage at csp is greater than voltage at csn by a particular amount corresponding to the offset. In other words, threshold and comparator circuit 130 can inject the offset from resistor 138 in negative polarity voltage, received at csn, of the differential feedback voltage signal 180. In an aspect, a trip point can occur when the voltage at csp is higher than the voltage at csn by VDAC/12. At this trip point, the current in transistors 132, 136 will be equal and half of $I_P$ can be flowing through resistor 138. In some embodiments, the amount of offset between voltages at csp and csn may correspond to the current $I_P$ output from current mirror 128, e.g., Vdac/6R, times the value of resistor 138, R. Amplifier and offset circuit 130 may have a resistor value R for resistor 138 that corresponds to predetermined positive current threshold (e.g., +OCL Threshold) over which modulator 110 is configured to adjust the PWM signal driving power driver 210 at a particular Vdac, where adjustments to Vdac may further modify the threshold as needed in a relatively easy way to control linear manner by adjusting the current being mirrored by current mirror circuit 128. As an example, if the difference between voltages at csp and csn meets or exceeds the trip point of the predetermined positive current threshold (e.g., +OCL Threshold), e.g., the amplified currents output by transistors 132 and 136 are equal or the current from transistor 132 is greater than the current from transistor 136, the pocl signal may transition from low to high, or 0 to 1 if digital, and modulator 110 may cause a corresponding truncation (e.g., reduce) in the on-time of $PWM_1$ to reduce the current on inductor L and inhibit the positive over current scenario from continuing or getting worse. As an example, the use of resistor 138 creates a fast circuit based current offset between transistors 132 and 136 and therefore between the voltages at csn and csp, e.g., the +OCL threshold offset of FIG. 1. For example, amplifier and offset circuit 130 may be configured to trip and output a high pocl signal when the voltage at csp is greater than the voltage at csn by a predetermined positive OCL (+OCL) threshold offset amount. In some embodiments, for example, the current on the positive and negative terminals of comparator 134 at the trip point may correspond to Vdac/12R.

The current $I_N$ output on connection N from current mirror circuit 128, e.g., Vdac/6R, is fed into an amplifier and offset circuit 140 that is configured to compare the voltages at csp and csn pins through an amplification of the current Ix using built-in offset circuitry in a similar manner to amplifier and offset circuit 130. Amplifier and offset circuit 140 comprise a transistor 142 having a source connected to current mirror 128, a gate connected to csn, and a drain connected to the negative terminal of a comparator 144. Threshold and comparator circuit 140 also comprises a transistor 146 having a source connected to current mirror 128 via a resistor 148, a gate connected to csp, and a drain connected to the positive terminal of comparator 144. Comparator 144 outputs the nocl signal. Resistor 148 has a resistance of R and is configured to create a current offset for one side of amplifier and offset circuit 140, e.g., the side containing transistor 146 connected to csp, relative to the other side, e.g., the side containing transistor 142 connected to csn. For example, the connections to csp and csn are reversed in amplifier and offset circuit 140 as compared to amplifier circuit 130.

Transistor 142 is configured to adjust, e.g., amplify or perform another adjustment, the voltage at its source from current mirror 128 based on the voltage at the csn pin and output the adjusted voltage from its drain to the negative terminal of comparator 144. Similarly, transistor 146 is configured to adjust, e.g., amplify or perform another adjustment, the voltage at its source from resistor 148 based on the voltage at the csp pin and output the adjusted voltage from its drain to the positive terminal of comparator 144. Based on the voltages at the drains of transistors 142 and 146, comparator 144 may determine whether or not a trip point, e.g., when the positive and negative terminals of comparator 144 are equal, has been reached or exceeded. In some embodiments, the gain from the amplification by comparator 144 may be 4× or any other amount of gain which may reduce error contributions from comparator 144 as compared to comparing raw, unamplified, signals.

Because of the presence of resistor 148, the current at the sources of transistors 142 and 146 will be offset, e.g., the current at the source of transistor 142 will be lower than the current at the source of transistor 146, such that the trip point of comparator 144 corresponds to a case where voltages at csn and csp have different values, e.g., where voltage at csn is greater than the voltage at csp by a particular amount corresponding to the offset. In other words, threshold and comparator circuit 140 can inject the offset from resistor 148 in positive polarity voltage, received at csp, of the differential feedback voltage signal 180. In an aspect, a trip point can occur when the voltage at csn is higher than the voltage at csp by VDAC/12. At this trip point, the current in transistors 142, 146 will be equal and half of Ix can be flowing through resistor 148. In some embodiments, the amount of offset between the voltages at csp and csn may correspond to the current $I_N$ output from current mirror 128, e.g., Vdac/6R, times the value of resistor 148, R. Amplifier and offset circuit 140 may have a resistor value R for resistor 148 that corresponds to the predetermined negative current threshold (e.g., −OCL Threshold) over which modulator 110 is configured to adjust the PWM signal driving power driver 210 at a particular Vdac where adjustments to Vdac may further modify the threshold as needed in a relatively easy way to control linear manner by adjusting the current being mirrored by current mirror circuit 128. As an example, when the difference between csp and csn meets or falls below the trip point of the predetermined negative current threshold (e.g., −OCL Threshold), e.g., the amplified currents output by transistors 142 and 146 are equal or the current from transistor 142 is greater than the current from transistor 146, the nocl signal may transition from low to high, or 0 to 1 if digital, and modulator 110 may cause a corresponding truncation or reduction in the off-time of $PWM_1$ to inhibit the negative over current scenario from continuing or getting worse. As an example, the use of resistor 148 creates a fast circuit based current offset between transistors 142 and 146 and therefore between the voltages at csn and csp, e.g., the −OCL threshold offset of FIG. 1. For example, amplifier and offset circuit 140 may be configured to trip and output a high nocl signal when the voltage at csn is greater than the voltage at csp by a predetermined negative OCL (−OCL) threshold offset amount.

While cycle-by-cycle current limit circuit 120 is illustrated as having both the positive over current limit circuitry (amplifier and offset circuit 130) and negative over current limit circuitry (amplifier and offset circuit 140) and functionality in the embodiment of FIG. 4, in other embodiments, only one of the positive and negative over current limit circuitry may alternatively be utilized or included. As an example, in some embodiments, amplifier and offset circuit 130 may be included in cycle-by-cycle current limit circuit 120 but amplifier and offset circuit 140 may not, or vice versa, with only the corresponding pocl or nocl signal being output.

The embodiments of cycle-by-cycle current limit circuit 120 described above provides an elegant circuit based amplification and offset functionality that minimizes offset error variations, is inherently fast and reduces error contributions from the comparators. Cycle-by-cycle current limit circuit 120 is configured to operate over a wide common mode voltage range for the csp and csn feedback inputs, e.g., −100 mV to 3.1V in some embodiments, and is configured to function even during startup or short conditions where Vout is 0V. Cycle-by-cycle current limit circuit 120 also comprises an easily adjusted threshold value for the offsets, e.g., by adjusting the DAC input value as described above. In some embodiments, the use of matched resistors for each part of the comparator logic for amplifier and offset circuits 130 and 140 may enable the setting of a precise offset threshold while the gain, e.g., 4× gain or another value, generated by amplifying the current signals using transistors 132, 136, 142 and 146 based on the voltages at csp and csn pins for input to comparators 134 and 144 enables the reduction of errors due to the comparators. Cycle-by-cycle current limit circuit 120 also provides high speed with an open-loop input stage that provides both gain and offset, which helps improve overdrive and speed into the comparators.

FIG. 5 is a flow diagram illustrating a process to implement cycle-by-cycle over current limit circuit in one embodiment. The process can include one or more operations, actions, or functions as illustrated by one or more of blocks shown in FIG. 5. Although illustrated as discrete blocks, various blocks can be divided into additional blocks, combined into fewer blocks, eliminated, performed in different order, or performed in parallel, depending on the desired implementation.

Process 500 can be performed by a controller of power supply system, such as controller 100 of system 10 described in the present disclosure, to limit over current in a switching power supply. Process 500 can begin at block 502. At block 502, a controller can receive a differential feedback voltage signal from a power stage, wherein the differential feedback voltage signal is proportional to an inductor current through an inductor in the power stage.

Process 500 can proceed from block 502 to block 504. At block 504, the controller can amplify the differential feedback voltage signal to generate a differential threshold that includes an upper bound and a lower bound. In one embodiment, the controller can amplify the differential feedback voltage signal comprises by injecting an offset to generate the differential threshold, wherein the offset is a current that corresponds to a current limit. In one embodiment, the controller can amplify the differential feedback voltage signal comprises by injecting a first offset in a positive polarity voltage signal of the differential feedback voltage signal and injecting a second offset in a negative polarity voltage signal of the differential feedback voltage signal.

Process 500 can proceed from block 504 to block 506. At block 506, the controller can compare the amplified differential feedback voltage signal with the differential threshold. In one embodiment, the controller can compare the differential feedback voltage signal with the differential threshold by determining a difference between the differential feedback voltage signal and the differential threshold. The controller can determine that the difference is greater than zero. The controller can, in response to determining that the difference is greater than zero, determine that the inductor current exceeds the current limit and an over current condition has occurred.

Process 500 can proceed from block 506 to block 508. At block 508, the controller can, based on a result of the comparison of the amplified differential feedback voltage signal with the differential threshold, determine whether to adjust at least one of a modulator on-time and a modulator off-time of a control signal to limit the inductor current, wherein the control signal is for driving the power stage.

In one embodiment, the controller can determine the result of the comparison of the amplified differential feedback voltage signal with the differential threshold indicates that the amplified differential feedback voltage signal is greater than the upper bound of the differential threshold. The amplified differential feedback voltage signal being greater than the upper bound of the differential threshold can indicate an occurrence of an over current condition. The controller can reduce the modulator on-time of the control signal to limit the inductor current.

In one embodiment, the controller can determine the result of the comparison of the amplified differential feedback voltage signal with the differential threshold indicates that the amplified differential feedback voltage signal is less than the lower bound of the differential threshold. The amplified differential feedback voltage signal being less than the lower bound of the differential threshold can indicate an occurrence of an over current condition. The controller can reduce the modulator off-time of the control signal to limit the inductor current.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be implemented substantially concurrently, or the blocks may sometimes be implemented in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A system comprising:

a power stage connected to an inductor and being configured to drive an inductor current through the inductor to a power supply output;

a controller configured to generate a control signal to drive the power stage;

a current limit circuit configured to:

receive a differential feedback voltage signal from the power stage, wherein the differential feedback voltage signal is proportional to the inductor current;

amplify the differential feedback voltage signal to generate a differential threshold that includes an upper bound and a lower bound;

compare the amplified differential feedback voltage signal with the differential threshold; and output an over current limit signal to the controller, wherein the over current limit signal is based on a result of the comparison of the amplified differential feedback voltage signal with the differential threshold, wherein the controller is further configured to determine whether to adjust at least one of a modulator on-time and a modulator off-time of the control signal to limit the inductor current based on the over current limit signal.

2. The system of claim 1, wherein:

the result of the comparison of the amplified differential feedback voltage signal with the differential threshold indicates that the amplified differential feedback voltage signal is greater than the upper bound of the differential threshold;

the amplified differential feedback voltage signal being greater than the upper bound of the differential threshold indicates an occurrence of an over current condition; and the controller is configured to reduce the modulator on-time of the control signal to limit the inductor current.

3. The system of claim 1, wherein:

the result of the comparison of the amplified differential feedback voltage signal with the differential threshold indicates that the amplified differential feedback voltage signal is less than the lower bound of the differential threshold;

the amplified differential feedback voltage signal being less than the lower bound of the differential threshold indicates an occurrence of an over current condition; and the controller is configured to reduce the modulator off-time of the control signal to limit the inductor current.

4. The system of claim 1, wherein the current limit circuit is configured to amplify the differential feedback voltage signal by injecting an offset to generate the differential threshold, wherein the offset is a current that corresponds to a current limit.

5. The system of claim 4, wherein the current limit circuit is configured to:

compare the differential feedback voltage signal with the differential threshold by determining a difference between the differential feedback voltage signal and the differential threshold;

determine that the difference is greater than zero; and in response to determination that the difference is greater than zero, output the over current limit signal that indicates an over current condition has occurred.

6. The system of claim 1, wherein the current limit circuit comprises:

a first amplifier configured to amplify a positive polarity voltage signal of the differential feedback voltage signal; and a second amplifier configured to amplify a negative polarity voltage signal of the differential feedback voltage signal.

7. The system of claim 6, wherein:

the first amplifier comprises a first transistor, wherein a current of the positive polarity voltage signal of the differential feedback voltage signal drives a gate of the first transistor to cause the first transistor to amplify the positive polarity voltage signal of the differential feedback voltage signal; and the second amplifier comprises a second transistor, wherein a current of the negative polarity voltage signal of the differential feedback voltage signal drives a gate of the second transistor to cause the second transistor to amplify the negative polarity voltage signal of the differential feedback voltage signal.

8. A method comprising:

receiving a differential feedback voltage signal from a power stage, wherein the differential feedback voltage signal is proportional to an inductor current through an inductor in the power stage;

amplifying the differential feedback voltage signal to generate a differential threshold that includes an upper bound and a lower bound;

comparing the amplified differential feedback voltage signal with the differential threshold; and based on a result of the comparison of the amplified differential feedback voltage signal with the differential threshold, determining whether to adjust at least one of a modulator on-time and a modulator off-time of a control signal to limit the inductor current, wherein the control signal is for driving the power stage.

9. The method of claim 8, further comprising:

determining the result of the comparison of the amplified differential feedback voltage signal with the differential threshold indicates that the amplified differential feedback voltage signal is greater than the upper bound of the differential threshold, wherein the amplified differential feedback voltage signal being greater than the upper bound of the differential threshold indicates an occurrence of an over current condition; and reducing the modulator on-time of the control signal to limit the inductor current.

10. The method of claim 8, further comprising:

determining the result of the comparison of the amplified differential feedback voltage signal with the differential threshold indicates that the amplified differential feedback voltage signal is less than the lower bound of the differential threshold, wherein the amplified differential feedback voltage signal being less than the lower bound of the differential threshold indicates an occurrence of an over current condition; and reducing the modulator off-time of the control signal to limit the inductor current.

11. The method of claim 8, wherein amplifying the differential feedback voltage signal comprises injecting an offset to generate the differential threshold, wherein the offset is a current that corresponds to a current limit.

12. The method of claim 11, wherein:

comparing the differential feedback voltage signal with the differential threshold comprises determining a difference between the differential feedback voltage signal and the differential threshold;

determining that the difference is greater than zero; and in response to determining that the difference is greater than zero, determining that the inductor current exceeds the current limit and an over current condition has occurred.

13. The method of claim 8, wherein amplifying the differential feedback voltage signal comprises:

injecting a first offset in a positive polarity voltage signal of the differential feedback voltage signal; and injecting a second offset in a negative polarity voltage signal of the differential feedback voltage signal.

14. A semiconductor device comprising:

a modulator configured to generate a control signal to drive a power stage;

a current limit circuit configured to:

receive a differential feedback voltage signal from the power stage, wherein the differential feedback voltage signal is proportional to an inductor current through an inductor in the power stage;

amplify the differential feedback voltage signal to generate a differential threshold that includes an upper bound and a lower bound;

compare the amplified differential feedback voltage signal with the differential threshold; and output an over current limit signal to the modulator, wherein the over current limit signal is based on a result of the comparison of the amplified differential feedback voltage signal with the differential threshold, wherein the modulator is further configured to determine whether to adjust at least one of a modulator on-time and a modulator off-time of the control signal to limit the inductor current based on the over current limit signal.

15. The semiconductor device of claim 14, wherein:

the result of the comparison of the amplified differential feedback voltage signal with the differential threshold indicates that the amplified differential feedback voltage signal is greater than the upper bound of the differential threshold;

the amplified differential feedback voltage signal being greater than the upper bound of the differential threshold indicates an occurrence of an over current condition;

the over current limit signal indicates that a positive polarity voltage of the differential feedback voltage signal is greater than a negative polarity voltage of the differential feedback voltage signal; and the modulator is configured to reduce the modulator on-time of the control signal to limit the inductor current.

16. The semiconductor device of claim 14, wherein:

the result of the comparison of the amplified differential feedback voltage signal with the differential threshold indicates that the amplified differential feedback voltage signal is less than the lower bound of the differential threshold;

the amplified differential feedback voltage signal being less than the lower bound of the differential threshold indicates an occurrence of an over current condition;

the over current limit signal indicates that a negative polarity voltage of the differential feedback voltage signal is greater than a positive polarity voltage of the differential feedback voltage signal; and the modulator is configured to reduce the modulator off-time of the control signal to limit the inductor current.

17. The semiconductor device of claim 14, wherein the current limit circuit is configured to amplify the differential feedback voltage signal by injecting an offset to generate the differential threshold, wherein the offset is a current that corresponds to a current limit.

18. The semiconductor device of claim 17, wherein the current limit circuit is configured to:

compare the differential feedback voltage signal with the differential threshold by determining a difference between the differential feedback voltage signal and the differential threshold;

determine that the difference is greater than zero; and in response to determination that the difference is greater than zero, output the over current limit signal that indicates an over current condition has occurred.

19. The semiconductor device of claim 14, wherein the current limit circuit comprises:

a first amplifier configured to amplify a positive polarity voltage signal of the differential feedback voltage signal; and a second amplifier configured to amplify a negative polarity voltage signal of the differential feedback voltage signal.

20. The semiconductor device of claim 19, wherein:

the first amplifier comprises a first transistor, wherein a current of the positive polarity voltage signal of the differential feedback voltage signal drives a gate of the first transistor to cause the first transistor to amplify the positive polarity voltage signal of the differential feedback voltage signal; and the second amplifier comprises a second transistor, wherein a current of the negative polarity voltage signal of the differential feedback voltage signal drives a gate of the second transistor to cause the second transistor to amplify the negative polarity voltage signal of the differential feedback voltage signal.

* * * * *